US007706110B2

(12) United States Patent
Bock et al.

(10) Patent No.: US 7,706,110 B2
(45) Date of Patent: Apr. 27, 2010

(54) COMPACT SUPERCONDUCTING CURRENT LIMITING COMPONENT IN COIL CONFIGURATION WITH LOW INDUCTANCE

(75) Inventors: Joachim Bock, Erftstadt (DE); Steffen Elschner, Heidelberg (DE); Frank Breuer, Bonn (DE)

(73) Assignee: Nexans, Paris (FR)

( * ) Notice: Subject to any disclaimer, the term of this patent is extended or adjusted under 35 U.S.C. 154(b) by 323 days.

(21) Appl. No.: 11/314,824

(22) Filed: Dec. 21, 2005

(65) Prior Publication Data

US 2006/0217269 A1  Sep. 28, 2006

(30) Foreign Application Priority Data

Jan. 12, 2005  (EP) .................................. 05300030

(51) Int. Cl.
*H02H 3/00* (2006.01)
(52) U.S. Cl. ............................................ 361/19; 361/8
(58) Field of Classification Search ................ 361/8–10, 361/19; 505/124; 335/216
See application file for complete search history.

(56) References Cited

U.S. PATENT DOCUMENTS

| 5,081,075 | A | * | 1/1992 | Jin et al. | 505/410 |
| 5,225,957 | A | * | 7/1993 | Tsurunaga | 361/19 |
| 5,361,055 | A | * | 11/1994 | Peck | 335/216 |
| 6,646,528 | B2 | * | 11/2003 | Ehrenberg et al. | 335/216 |
| 6,809,910 | B1 | * | 10/2004 | Yuan et al. | 361/19 |
| 6,947,265 | B2 | * | 9/2005 | Mine et al. | 361/19 |

FOREIGN PATENT DOCUMENTS

JP            07272958 A   *  10/1995

* cited by examiner

*Primary Examiner*—Danny Nguyen
(74) *Attorney, Agent, or Firm*—Sofer & Haroun, LLP

(57) ABSTRACT

The present invention is directed to a superconducting current limiting component, particularly to a ceramic high temperature superconducting current limiting component which is self triggering, comprising a coil (1) made of ceramic high temperature superconductor material, wherein around the outer surface of the coil (1) made of ceramic high temperature superconductor material a second coil (3) is applied as a shunt and, preferably, wherein the coil (1) made of ceramic high temperature superconductor material is applied onto a hollow cylindrical body (2) made of a ceramic high temperature superconductor material.

21 Claims, 1 Drawing Sheet

COMPACT SUPERCONDUCTING CURRENT LIMITING COMPONENT IN COIL CONFIGURATION WITH LOW INDUCTANCE

RELATED APPLICATION

This application is related to and claims the benefit of priority from, European Patent Application No. 05 300 030.3, filed on Jan. 12, 2005, the entirety of which is incorporated herein by reference.

FIELD OF THE INVENTION

The present invention relates to a superconducting current limiting component, particularly to a resistive ceramic high-temperature superconducting current limiting component which is self-triggering.

BACKGROUND

Superconductors, in particular ceramic high-temperature superconductors, offer a great potential as fault current limiters which enable rapid and effective current limitation, automatic recovery, negligible impedance during normal operation and application at high voltage.

Current limiters based on high-temperature superconducting materials make use of the property of superconducting materials to switch from their superconducting state with essentially no resistance to a normal conductive state when at least one of its critical temperature (Tc), critical magnetic field (Hc) or critical current (Ic) is exceeded.

For example, in case of fault the current flowing through the superconductor material exceeds the critical current of the superconductor material due to large surge current and the superconducting material undergoes transition from the superconducting state to the normal conducting state. This transition is also termed "quenching". For good operation, after the current limiting event the superconductor should have the capability to return to its superconducting state.

There are known different embodiments of superconducting current limiters. In so called resistive (ohmic) limiters a superconducting element becomes normally conductive. The occurring resistance limits the current in the case of fault current events.

There are also known so called inductive current limiters. When applied with fault current, the inductive current limiter provides a high impedance which limits the fault current below a threshold level. For example, U.S. Pat. No. 5,140,290 discloses a device for inductive current limiting of alternating current, in which the current to be limited flows through an induction coil made of copper. A hollow cylinder of a high temperature superconducting material is arranged in the interior of this coil, and a soft magnetic material with high permeability is arranged concentrically inside. In normal operation (rated current) the superconductivity of the hollow cylinder shields the magnetic field of the induction coil completely from the core and impedance of the induction coil is maintained at a very low level. When a fault current flows through the induction coil the superconductivity of the hollow cylinder body disappears and the impedance of the induction coil reaches its maximum current-limiting value.

In all the different limiter concepts, due to the increasing resistance during quench the superconducting material is heated up along its length.

In practical, however, the superconducting material of which a superconductor body is made is not completely homogeneous throughout the superconductor body, so that the superconductor properties such as critical current density can be different at different regions of the superconductor body. Consequently, in case of fault current some regions become already resistive whereas other regions still remain superconducting. Due to the still superconducting regions high current flows through the superconductor body leading to a high temperature increase in the already resistive regions and causing burn out in these regions. Thus, in order to avoid damage of the superconductor body during quenching it is necessary that the quenching and, consequently heating of the superconductor body, occurs as homogenously and rapidly as possible so that the superconductor body becomes resistive as a whole within a time sufficiently short to avoid thermal destruction of the superconductor body due to local overheating ("hot spots").

For solving the problem of local overheating it was known to provide the superconductor body with a parallel shunt of normal conducting material whose resistance is lower than the resistance of the superconducting material in its normal conducting state. In case of default and, thus, sudden temperature increase, current is by-passed to the shunt and heat is dissipated. In the course thereof the shunt material is heated up.

Commonly, the electrically conducting material for the shunt is a metal such as copper or copper alloy.

For example, resistive current limiters are suggested which are composed of a cylindrical tubular superconductor body having a stripe of electrically conducting metal coated on its outer surface in parallel to the longitudinal axis and reaching from one end of the cylindrical tubular body to its other end. Superconductor components related to such configuration are referred to in WO 00/8657.

In DE 42 34 312 a resistive high-temperature superconductor current limiter is disclosed wherein the superconductor component has the shape of a bifilar spiral. On one face of the bifilar spiral made of the superconductor material all along its winding a metal coating is applied for the shunt.

Since in all of these configurations the shunts are arranged in parallel with the superconductor body both the shunt as well as the superconductor body have nearly the same length.

The necessary minimum length of the current limiter at a given voltage, however, is defined by the maximum strength of the electrical field which can be applied along the normal conducting shunt during short circuit. If the electrical field acting on the shunt during short circuit exceeds the maximum value overheating of the shunt occurs with temperatures exceeding the melting point of the shunt material and, consequently, the shunt melts.

For illustration, the maximum electrical field applicable to commonly used shunt materials is about 1 V/cm. That is, if a voltage of 10 kV is applied to the current limiter the length of the superconductor body has to be about 100 m in order to limit the electrical field to which the shunt is subjected during fault event to about 1 V/cm.

However, this means, that, for example, in high-voltage applications high-temperature superconductor bodies are required having a very long length which in turn requires large material need with subsequent costs.

It was also known to apply an external magnetic field to the superconductor body of a superconducting current limiting device in order to assist quenching. By said magnetic field the critical current density of the superconductor material is reduced which, in turn, promotes quenching. These devices make use of the fact, that the critical current density decreases with increasing magnetic field.

In U.S. Pat. No. 6,043,731 a superconducting current limiting device is disclosed wherein magnetic field generating means are provided for generating and applying, during normal operation in the superconducting state, a magnetic field to the superconductor element in order to hold the current density below the critical current density. In the fault event the magnetic field is adjusted, that is, increased to reduce the critical current density in order to bring the superconductor element to its resistive state.

According to one embodiment of U.S. Pat. No. 6,043,731 the superconductor element is positioned within a shunt coil which is connected in parallel to the superconductor element. In fault event excess current is forced into the shunt coil and the current flow in the shunt coil generates a magnetic field which acts on the superconductor element and decreases the critical current density, thereby assisting quenching.

As superconductor element a thin film superconductor is disclosed on a semiconducting substrate. According to the figure layers of superconductor thin films and layers of the substrate alternate, that is the superconductor element is a stack of layers of superconductor thin films and layers of substrates.

However, further details as to the specific constructions of this embodiment, in particular of the resulting shape of the superconductor element, are not given.

Furthermore, a recently favored geometry is disclosed in J. Bock, F. Breuer, H. Walter, M. Noe, R. Kreutz, M. Kleimaier, K. H. Weck, S. Elschner, "Development and successful testing of MCP-BSCCO 2212 components for a 10 MVA resistive fault current limiter", Supercond. Sci. Technol. 17, pp. S122-S126, 2004. Here bifilar coils are used for the current limiters. Due to the bifilar geometry the induction inherent to coil configuration is small. However, since in bifilar coils input and exit for the current are close together, in particular with respect to high voltage applications insulation is problematical.

OBJECTS AND SUMMARY

In view of the above it was the object of the present invention to provide a superconducting current limiting component with a shunt which makes possible to build up sufficiently high electrical field along the superconducting material during the short circuit, within a short time, which can be produced in a simple and cheap way, and which is capable to create a magnetic field high enough to bring the superconductor material to homogenous quench in the short circuit case. Further, it was the object of the present invention to provide a superconducting current limiting component with a space saving low inductive element design which is easily to be insulated even with respect to high voltages.

According to the present invention these objectives are solved by a superconducting current limiting component comprising a coil made of ceramic high temperature superconductor material. Around the outer surface of this first coil made of a ceramic high temperature superconductor material a second coil is applied which acts as a shunt and generates the desired magnetic field.

According to a preferred embodiment a hollow cylindrical body of ceramic high temperatures superconductor material can be introduced into the first superconducting coil.

According to a further embodiment a support element for stabilization can be provided, e.g. between the first coil and the hollow cylindrical body made of a ceramic high temperature superconductor material.

In the following the first coil made of a ceramic high temperature superconductor material is also referred to as "htsc coil" and the hollow cylindrical body made of a ceramic high temperature superconductor material as "htsc tube".

In the current limiting component according to the present invention during normal operation nominal current flows through the htsc coil.

According to the present invention, due to the coil configuration with the same component height the superconductor length can be significantly increased as compared to the superconductor length of the conventional current limiting device having a tube shaped configuration.

For example with the present invention the superconductor length can be increased to the 10-fold with the same component height.

In the default case the resistance appearing in the htsc coil due to the fault current causes a part of the current to by-pass into the shunt coil which is provided around the outer surface of the htsc coil and is connected electrically and physically in parallel with the htsc coil. The magnetic field associated with this current, serves to bring the superconductor material in a uniform quench during the short circuit event and to avoid material degradation, for example, due to hot spot formation.

For example with the design of the shunt of the present invention it is possible to build up high electrical fields of e.g. 1 to 10 V/cm or higher along the superconductor material during short circuit within the desired short circuit time of 100 ms, however, which can be also more or less.

Due to the specific design the superconducting current limiting component of the present invention is self-triggering, which means, that the current limiting component has the capability of detecting and limiting fault current without active or external control.

According to a preferred embodiment a hollow cylindrical body of ceramic high temperature superconductor material ("htsc tube") can be introduced into the interior cavity of the htsc coil.

During normal operation both the htsc coil as well as the htsc tube are in the superconducting state and current flows through the htsc coil only. By the provision of the htsc tube the inductance inherent to coil configuration due to generation of magnetic field within the interior of the coil is strongly reduced. The principle is as follows:

By the htsc tube in its superconducting state the magnetic field generated inside the coil, is screened by azimuthal currents in the tube and therefore the inductance is reduced to nearly zero during normal operation.

In a further embodiment the htsc tube is dimensioned so that the htsc tube becomes resistive simultaneously or almost simultaneously with the quench of the htsc coil in default case when the current exceeds the critical current. In the result the superconductivity of the htsc tube and, thus, the screening of the magnetic field disappears with the consequence that within the htsc coil inductive impedance is generated. The inductive impedance of the htsc coil acts as an additional resistance which contributes to the ohmic resistance in the htsc coil due to quenching and further lowers the short circuit current.

In principle, the present invention may include any desired ceramic superconductor. Typical examples comprise oxide superconductors based on Bi-Ae-Cu—O, (Bi, Pb)-Ae-Cu—O, (Y, RE)-Ae-Cu—O or $MgB_2$.

In the above formula Ae means at least one alkaline earth element, particularly, Ba, Ca and/or Sr.

RE means at least one rare earth element, particularly Y or a combination of 2 or more of the elements Y, La, Lu, Sc, Sm, Nd or Yb.

In principle the superconductor of both, coil and tube, can be made from ceramic bulk materials, thick films or thin films.

Particularly, preferred examples have a composition of or approximately of $Bi_2(Sr, Ca)_2Cu_1O_x$, $(Bi, Pb)_2(Sr, Ca)_2Cu_1O_x$, $(Bi, Pb)_2(Sr, Ca)_3Cu_2O_{x'''}$, $(Bi, Pb)_2(Sr, Ca)_4Cu_3O_{x'''}$, $(Y, Re)_1Ba_2Cu_3O_y$, $(Y, Re)_2Ba_1Cu_1O_y$ and MgB2.

In the above formula x, y and z stand for the appropriate oxygen content at which the respective compounds exhibit superconductivity.

Especially suitable superconductors are those known by the reference BSCCO-2212, BSCCO-2223, wherein the numerical combinations 2212 and 2223 stands for the stoichiometric ratios of the elements Bi, Sr, Ca and Cu, in particular those, wherein part of Bi is substituted by Pb (also referred to B(Pb)SCCO-2212 and B(Pb)SCCO-2223); and that known by the reference YBCO-123, wherein the numerical combination 123 stands for the stoichiometric ratio of the elements Y, Ba and Cu.

Most preferably for the present invention BSCCO-2212, B(Pb)SCCO-2212-material and YBCO-123 is used. BSCCO-2212 and B(Pb)SCCO-2212 is particularly suitable for ceramic bulk applications whereas YBCO-123 in thin films applications.

If needed further elements may be present in the superconductor material. For example, BSCCO based superconductor materials may contain $SrSO_4$ and/or $BaSO_4$ as auxiliaries in an amount up to 20 percent by weight or when $BaSO_4$ is used, preferably only up to about 10 percent by weight.

Such compounds are disclosed for example in EP-A-0 524 442 and EP-A-0 573 798 to which reference is explicitly made.

In general, ceramic oxide high-temperature superconductors as, for example, referenced above and methods for their production are well known in the art. A summary of suitable high-temperature superconductors and production method thereof is given in WO 00/08657.

YBCO-based superconductor bodies can be, for example, prepared by mixing the metal oxides, or compounds which are converted to metal oxides on heating, in suitable molar ratios, heating the mixture in the presence of oxygen to a temperature of between about 800 and about 1100° C. and slowly cooling the mixture in the presence of oxygen over a period of at least about 1 hour.

BSCCO-based superconductor bodies can be prepared by mixing oxides or carbonates or mixtures of the respective elements in suitable mixing ratios. Subsequently, calcining is carried out at a temperature of about 700 to 900° C. for a period of about 2 to about 20 hours, the calcined mixture is ground, converted into the desired shape and sintered at a temperatures of about 800 to about 1100° C. in the semi- or fully-molten state. Examples of suitable BSCCO-based compounds and production methods thereof are found, for example, in EP-B0 330 305 and EP-A-0 327 044, to which reference is expressly made here.

Particularly preferred are superconductor bodies produced using a molten casting method, in particular a centrifugal casting method as disclosed, for example, in DE-A-38 30 092, EP-A-0 451 532, EP-A-0 462 409 and EP-A-0 477 493, to which reference is likewise expressly made.

For example, in EP 0 462 409 a process for the production of tubular superconductor bodies is disclosed, wherein an oxide starting mixture is allowed to run in a predetermined stoichiometry at temperatures from 900 to 1100° C. into a casting zone rotating about its horizontal axis. The solidified shaped body is taken out of the casting zone and heat-treated for 4 to 150 hours at 700 to 900° C. in an oxygen containing atmosphere. This process is particularly suitable for BSCCO-based superconductor bodies.

BRIEF DESCRIPTION OF THE DRAWINGS

In the following the present invention is further illustrated with reference to the figures showing a preferred embodiment of the superconducting current limiting component of the present invention without being limited thereto.

It is shown in

DETAILED DESCRIPTION

Figure 1:
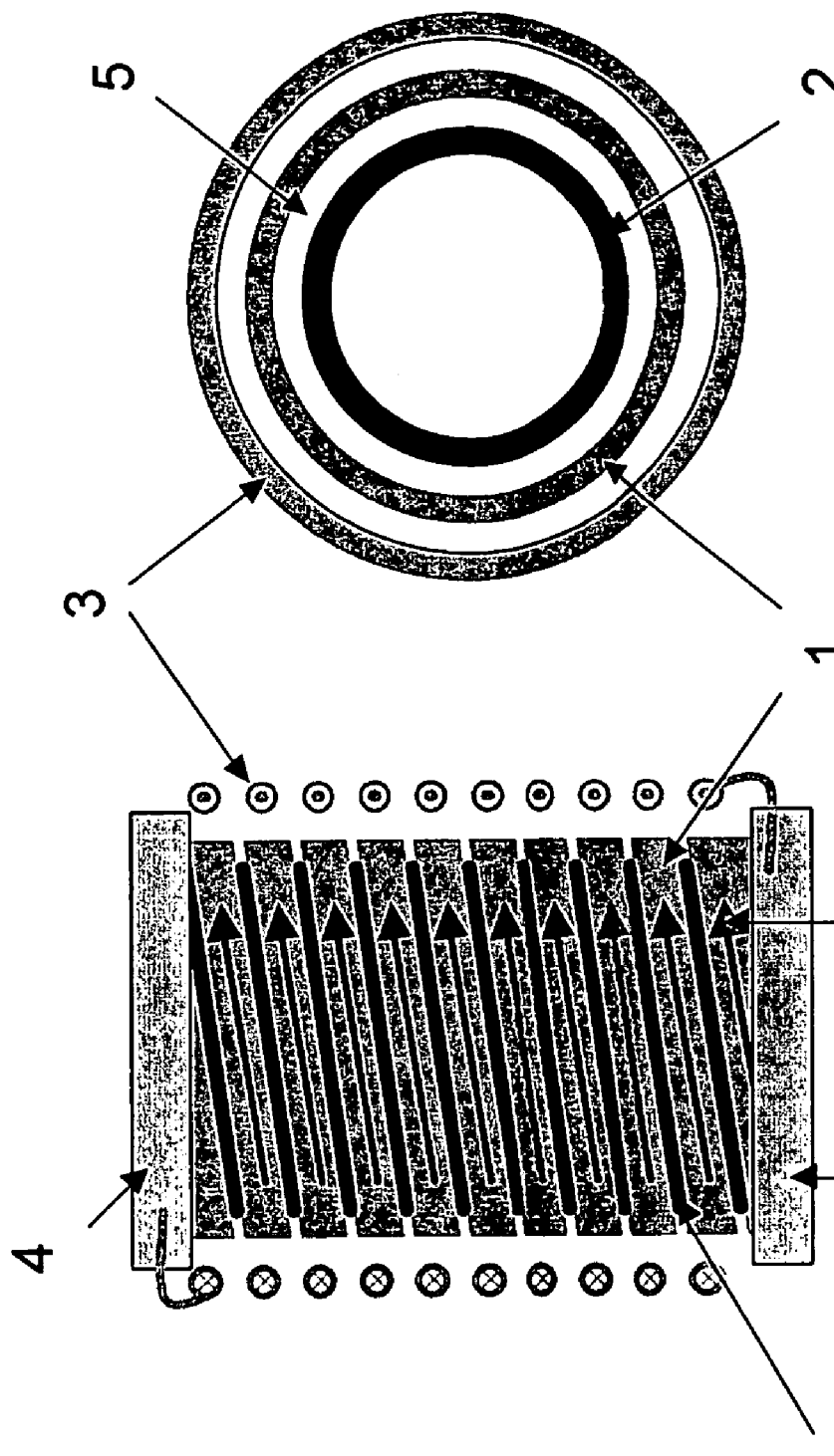
FIG. 1 a longitudinal section of a preferred embodiment of the superconducting current limiting component of the present invention, and in FIG. 2 a cross section of the embodiment according to FIG. 1.

In FIG. 1 the current flow during normal operation within the htsc coil 1 and the htsc tube 2 in the superconducting state is shown by indicating the flow direction 6 of the current by arrows. The flow direction in FIG. 1 represents a snapshot because of AC current with changing flow direction.

As shown in FIG. 1 the htsc coil 1 is provided tightly around the htsc tube 2 from one end of the htsc tube 2 to the other end.

Further, a normal conducting shunt 3 is wound around the outer surface of the htsc coil 1. At both ends of the current limiter electric contacts 4 are provided, wherein the normal conducting shunt 3 is connected to the electric contacts 4 at both ends.

Figure 2:
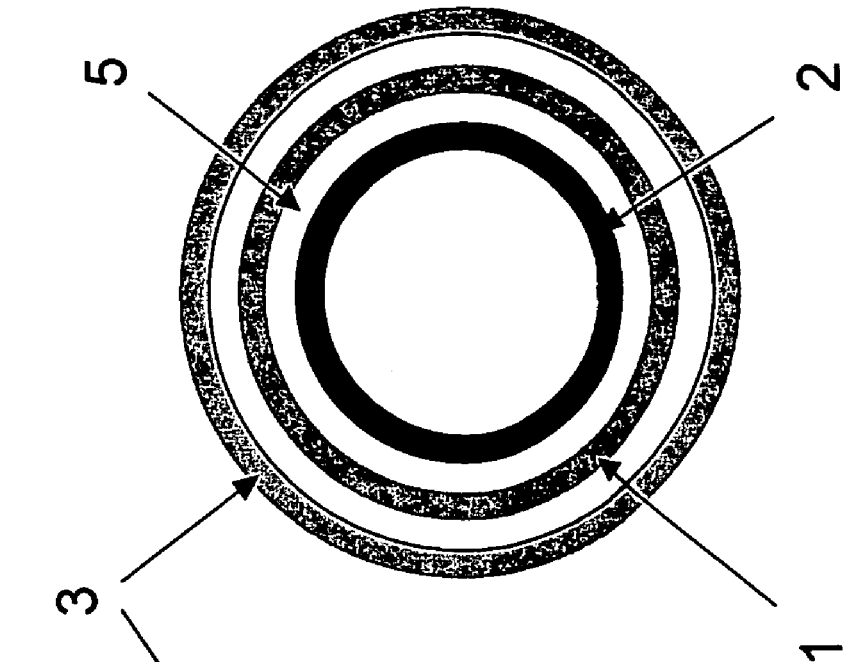

As shown in FIG. 2 in this embodiment a support element 5 is provided which is arranged between the htsc tube 2 and the htsc coil 1.

In the following the single elements of the superconducting current limiting component of the present invention, preparation thereof as well as preparation of the superconducting current limiting component are explained in further detail.

For preparing the htsc coil 1 and the htsc tube 2 as used in the present invention preferably the same starting material, and, in particular, the same method can be applied. That is, preferably both the htsc coil 1 as well as the htsc tube 2 have the same chemical composition.

In principle, the htsc coil 1 and the htsc tube 2 can be obtained starting from similar shaped bodies.

A suitable starting material for a shaped body from which the htsc tube 2 and/or the htsc coil 1 according to the present invention can be obtained is a shaped body made from a pre-fired, sintered or post-annealed superconducting material. In order to obtain a high quality superconductor material, it is in principle necessary to perform the process stages of pre-firing, such as e.g. calcining, sintering and optionally post-annealing, which may be carried out in a single firing operation or in several, possibly repeated, sub stages.

However, it is also possible, to start with a high quality superconducting material, which contains a high proportion of one or more superconducting phases.

A suitable starting geometry for the shaped body for the htsc tube 2 and htsc coil 1, respectively, is a rod or a tube with substantially cylindrical external geometry. Solid articles can be converted into corresponding hollow articles by mechanical processing. The shaped body should, if appropriate, have a maximally uniform thickness, in particular a cylindrical cavity concentric with the external surface.

For providing the htsc tube 2 with the htsc coil 1, preferably, the tubular shaped body used for the htsc tube 2 is introduced into the hollow interior of the tubular shaped body intended for the htsc coil 1.

To this, the dimensions of the tubular shaped body are adjusted in an appropriate manner, such as external and internal diameters as well as the length of the tube. The volume of the tube should be as large as possible in order to minimize the inductance of the coil. That is, the interior cavity of the coil 1 should be filled by the htsc tube to the greatest possible extent.

Generally, the external diameter of the htsc tube 2 should be a little bit smaller than the internal diameter of the tubular shaped body for the htsc coil 1 so that a gap is formed with a sufficient width for incorporating an electrically insulating material and/or adhesive and/or mechanical stabilisation (as referred to in more detail later on).

It is also possible that an adhesive material used for connecting the htsc tube 2 to the tubular shaped body for the htsc coil 1 serves simultaneously as insulating material and/or support element.

Adhesives can be used known to be suitable for low temperature applications, such as self—curing single—or multicomponent adhesive mixtures (e.g. styrene resin, epoxy resin) or composite material based on organic and/or inorganic adhesive and fabric components (e.g. textile fabric and plaster compound).

The htsc coil 1 of the present invention can be obtained by cutting the desired coil profile into the jacket of the tubular shaped body for the htsc coil 1.

For example, cutting can be carried out by means of mechanical separation processes such as e.g. sawing, milling, boring, turning etc.

Suitable methods for preparing coils from a tubular shaped body of high-temperature superconducting material are, for example, disclosed in WO 99/22386 to which reference is expressly made.

The htsc coil extends from one end of the htsc tube 2 to the other end with at least one winding.

The thread profile is not particularly limited but can be selected according to need, in particular taking into consideration the operation conditions of the final superconducting current limiting component. For example, depending on the actual operation currents of the final superconducting current limiting component the number of windings and pitch may vary to obtain the desired cross-section and/or nominal current.

The shunt coil 3 wound around the outer surface of the htsc coil 1 typically is made of a normal conducting material, preferably a metal.

Suitable metals are copper, copper alloys, steel, etcetera, copper being preferred.

Further, also a suitable superconducting material can be used. Examples for suitable superconducting materials are tapes or wires, e.g. made of BSCCO-type material or YBCO thin films, (optionally with one or more additional and/or substitute element) as set out above with respect to the high temperature superconductor material for the htsc coil 1 and htsc tube 2.

In order to avoid premature current flow in the shunt coil 3 a high contact resistance or similar means should be provided, in particular, in case that the shunt coil 3 is made of a superconductor material.

For example, the shunt coil 3 can be made from a copper wire such as a lacquered wire or varnished wire wherein the wires are coated by a thin lacquer layer as commonly used in transformer applications. Preferably the inductance of the shunt coil should be as small as possible, in order to minimize its reaction time in the short circuit case.

For preparing the shunt coil 3 the wire can be wound directly onto the outer surface of the htsc coil 1.

Further, it is possible to provide the wire within the gaps cutted between two adjacent windings of the htsc coil 1, so that the windings of the shunt coil are in parallel to the windings of the htsc coil 1.

According to a further embodiment the shunt coil 3 can be wound around the htsc coil 1 at a distance. The gap, thus formed between the shunt coil 3 and the htsc coil 1 can be useful for improved cooling, for example with liquid nitrogen.

In this case for supporting the shunt coil 3 spacers can be provided. Suitable spacers can be bars extending from one end of the current limiting component to the other end in parallel or declined with respect to the longitudinal axis of the current limiting component.

Further, the spacer can be a tubular body made of a suitable electrically insulating material.

In this case the tubular spacer should be provided with bores for assisting the flow of the cooling medium.

According to yet a further embodiment the shunt coil 3 can be provided by coating the tubular shaped body for the htsc coil 1 with a layer of the material for the shunt coil 3 and, then, cutting the coil profile, e.g. simultaneously, into the layer and the htsc material. The layer can be provided onto the surface of the tubular shaped body for the htsc coil 1 by inserting the tubular shaped body into tightly fitting tubes or by encapsulating the external surface of the tubular shaped body for the htsc coil 1 with the respective material.

As is the case with the thread profile of the htsc coil 1 also the thread profile of the shunt coil 3, for example such as number of windings and pitch, can vary in accordance to the actual operation conditions of the final superconducting current limiter of the present invention. Generally, a suitable number of winding can be determined by the desired magnetic flux to be achieved during quench.

If needed the current limiting device can be also provided with one or more support elements 5 for stabilizing the component.

As support element 5, for example, a tubular shaped body made of an electrically insulating material can be arranged between the htsc tube 2 and the htsc superconducting coil 1 as shown in FIG. 2. The support element 5 can be made of a suitable plastic material, a glass fibre reinforced plastic (GFK) or carbon fibre reinforced plastic, or any other suitable plastic material.

It is also possible to use a layer formed of an adhesive or insulating material as support element.

Preferably, the material for the support element as well as the adhesive material referred to above should have a coefficient of thermal expansion which is as close as possible to the coefficient of expansion of the htsc material in order to avoid damage on cooling due to different dimensional changes of the components of the current limiter.

It is also possible to apply an external support element. In this case, for example, the spacers can act, simultaneously, as support elements.

The critical current density of the htsc tube 2 can be adjusted by appropriate dimensioning of the htsc tube 2, for example, by adjusting the wall thickness. If in case of default the current induced within the htsc tube 2 due to the surge current flowing in the htsc coil 1, exceeds the predetermined value of Jc the htsc tube 2 increases its resistance.

It should be noted, that typically the htsc tube 2 does not become completely normal conducting when the htsc coil quenches.

By adjusting Jc of the htsc tube 2 to Jc of the htsc coil 1 simultaneous or almost simultaneous resistance increase of the htsc tube 2 on one hand and quench of the htsc coil 1 on the other hand can be achieved.

Since the htsc tube 2 can have still a low resistance after the short circuit event (quench), there could be an arc-over between the contacts 4 via the htsc tube 2. According to the present invention this problem can be solved by cutting the htsc tube 2 perpendicular to the axis in one or more ring-sections. The cuts would interrupt the conductance in the htsc tube 2 in axial direction and therefore increase the resistance. It has been found that by these annular cuts the screening behaviour is not or nearly not influenced.

For current limiting applications a plurality of superconductor current limiting components according to the present invention can be used which are connected to each other in series and/or in parallel. There is no particular restriction. The number of superconductor current limiting components according to the present invention can be chosen according to need.

For the preparation of the superconducting current limiting component of the present invention also thin films can be used, for example so called coated conductors based on YBCO thin films. The preparation of thin films from YBCO and coated conductors based on YBCO thin films are well known in the art, see for example D. Larbalstier et al., "High-Tc superconducting materials for electric power application", Nature, Vol. 414, November 2001 pages 368.377. In particular, coated conductors can be used for the preparation of the htsc coil 1 and htsc tube 2.

The specific design of the superconducting current limiter of the present invention is particularly useful for applications with high voltages and medium nominal current, for example up to 1 kA, without, however, being limited thereto.

The superconducting current limiter of the present invention can be advantageously used for AC-applications.

In the following the present invention is further illustrated by a specific example without being limited to this example.

EXAMPLE

A superconducting current limiting component according to the present invention is designed for operation at the following conditions:

| rated current: | 600 A, 3-phase |
| nominal voltage: | 10 kV |
| limited current: | 3-4 times the rated current | htsc Coil 1:

A htsc coil is prepared from a melt cast BSCCO-2212 tube having an outer diameter of 25 mm, tube length of 30 cm with 40 mm contacts included having an electrical field of 5 V/cm in the short circuit case and Jc=5000 A/cm² at 65 K. The details are as follows:

required critical current (DC) for a rated current of 600 A=>1000 A.

cross section of the superconductor (coil 1): 1000 A/5000 A/cm²=20 mm²

| wall thickness of the tube: | 2 mm |
| pitch of the coil: | 10 mm |
| gap of cutting: | 1 mm |
| turns | 260 mm/11 mm = 23 turns |
| hts conductor length: | 23 × 76 mm = 175 cm |
| voltage/component: | 175 cm × 5 V/cm = 875 Volts | htsc Tube 2:

melt cast BSCCO-2212 (as for htsc coil 1)

| induced current: | 23 × 600 A = 13.8 kA |
| critical current: | 23 kA |
| length of tube: | 260 mm |
| cross section: | 23 kA/5000 A/cm² = 460 mm² |
| outer diameter: | 19 mm |
| wall thickness: | 460 mm²/260 mm = 1.8 mm |

Shunt Coil 3:

material: wire of copper alloy, directly wound on the outer surface of hts coil (1)

| cross section: | 1.5 mm² |
| turns: | 100 |
| magnetic field: | 480 mT/kA |
| impedance after quench: | approximately 400 mΩ |

For the operation conditions as set out above per phase 7 superconducting current limiting components composed as set out above are connected in series as results from the following formula: 10 kV/Sqrt 3=5770 V.

LIST OF REFERENCE NUMBERS

| 1 | htsc coil |
| 2 | htsc tube |
| 3 | shunt coil of normal conducting material |
| 4 | electric contacts |
| 5 | support element |
| 6 | flow direction of nominal current (snapshot) |

The invention claimed is:

1. Superconducting current limiting component comprising:
    a first monofilar coil made of a ceramic high temperature superconductor material;
    wherein around the outer surface of the first monofilar coil made of ceramic high temperature superconductor material, a single second coil is applied, said single second coil functioning as both a parallel shunt and simultaneously as a trigger coil, and
    wherein said single second coil is connected electrically and physically in parallel with the first monofilar coil.

2. Superconducting current limiting component according to claim 1, wherein into the first coil made of a ceramic high temperature superconductor material a hollow cylindrical body made of a ceramic high temperature superconductor material is inserted.

3. Superconducting current limiting component according to claim 1, wherein both the first coil and the hollow cylindrical body are made from the same ceramic high temperature superconductor material.

4. Superconducting current limiting component according to claim 1, wherein the ceramic high temperature superconductor material is selected from a ceramic oxide superconductor based on Bi-Ae-Cu—O, (Bi, Pb)-Ae-Cu—O, and (Y, RE)-Ae-Cu—O, wherein Ae means at least one of Ba, Ca and/or Sr, and wherein RE means at least one rare earth element selected from Y or a combination of two or more of the elements Y, La, Lu, Sc, Sm, Nd or Yb.

5. Superconducting current limiting component according to claim 4, wherein the superconductor material is selected from BSCCO-2212 and B(Pb)SCCO-2212.

6. Superconducting current limiting component according to claim 4, wherein the superconductor material is YBCO-123.

7. Superconducting current limiting component according to claim 1, wherein the first coil and/or the hollow cylindrical body are obtained from melt cast shaped bodies.

8. Superconducting current limiting component according to claim 1, wherein the first coil and/or the hollow cylindrical body are obtained from thin films based on YBCO-123 coated conductors.

9. Superconducting current limiting component according to claim 1, wherein the superconducting current limiting component further comprises at least one support element.

10. Superconducting current limiting component according to claim 9, wherein the at least one support element is arranged between the first coil and the hollow cylindrical body.

11. Superconducting current limiting component according to claim 1, wherein the second coil is made from a lacquered metal wire.

12. Superconducting current limiting device according to claim 1, wherein a plurality of superconducting current limiting component are connected to each other in series and/or in parallel.

13. Process for preparing a superconducting current limiting component according to claim 1, wherein said process includes applying the second coil as a shunt onto the first coil made of a ceramic high temperature superconductor material.

14. Process for preparing a superconducting current limiting component according to claim 13, wherein said process includes fitting a second tube made of ceramic high temperature superconductor material onto a first tube made of ceramic high temperature superconductor material;
cutting a thread profile into the second tube in order to obtain the first coil; and
applying the second coil as a shunt around the first coil.

15. Process according to claim 14, wherein said process includes using melt cast shaped bodies for the first and/or second tube.

16. Process according to claim 13, wherein the process includes using a ceramic high temperature superconductor material selected from BSCCO-2212 and B(Pb)SCCO-2212.

17. Process according to claim 13, wherein said process includes using a thin film based on YBCO-123 coated conductor for the preparation of the superconducting current limiting component.

18. Process for preparing a superconducting current limiting component, said process comprising the steps of:
arranging a first coil made of a ceramic high temperature superconductor material, wherein the process includes fitting a second tube made of ceramic high temperature superconductor material onto a first tube made of ceramic high temperature superconductor material;
cutting a thread profile into the second tube in order to obtain the first coil;
applying a second coil, as a parallel shunt and simultaneously as a trigger coil, around the outer surface of the first coil made of ceramic high temperature superconductor material, and
applying the second coil as a shunt around the first coil, wherein the second coil is connected electrically and physically in parallel with the first coil.

19. Process according to claim 18, wherein said process includes using melt cast shaped bodies for the first and/or second tube.

20. Process according to claim 18, wherein the process includes using a ceramic high temperature superconductor material selected from BSCCO-2212 and B(Pb)SCCO-2212.

21. Superconducting current limiting component comprising:
a first monofilar coil made of a ceramic high temperature superconductor material;
wherein around the outer surface of the first monofilar coil made of ceramic high temperature superconductor material, a single second coil is applied, said single second coil functioning as both a parallel shunt and simultaneously as a trigger coil;
wherein said single second coil is connected electrically and physically in parallel with the first monofilar coil; and
wherein into the first coil made of a ceramic high temperature superconductor material a hollow cylindrical body made of a ceramic high temperature superconductor material is inserted.

* * * * *